(12) United States Patent
Seefeldt

(10) Patent No.: US 7,283,010 B2
(45) Date of Patent: Oct. 16, 2007

(54) POWER SUPPLY COMPENSATED VOLTAGE AND CURRENT SUPPLY

(75) Inventor: James D. Seefeldt, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 63 days.

(21) Appl. No.: 11/254,473

(22) Filed: Oct. 20, 2005

(65) Prior Publication Data

US 2007/0090891 A1  Apr. 26, 2007

(51) Int. Cl.
*H03L 7/099* (2006.01)
(52) U.S. Cl. ........................ 331/185; 331/186
(58) Field of Classification Search .................. 331/186
See application file for complete search history.

(56) References Cited

U.S. PATENT DOCUMENTS

| | | | |
|---|---|---|---|
| 4,479,091 A | 10/1984 | Yoshisato | |
| 5,384,501 A | 1/1995 | Koyama et al. | |
| 6,256,362 B1 | 7/2001 | Goldman | |
| 6,326,855 B1 | 12/2001 | Jelinek et al. | ................ 331/57 |
| 6,441,691 B1 | 8/2002 | Jones et al. | |
| 6,683,930 B1 | 1/2004 | Dalmia | |
| 6,710,670 B2 | 3/2004 | Maneatis | |
| 6,856,202 B2 | 2/2005 | Lesso | |
| 2004/0238875 A1* | 12/2004 | Nakai | ......................... 257/314 |

FOREIGN PATENT DOCUMENTS

EP    0 580 209 A1    1/1994
WO    WO94/01936    1/1994

OTHER PUBLICATIONS

European Search Report for 06117519.6-1233 dated Jan. 30, 2007.
U.S. Appl. No. 11/254,281, filed Oct. 20, 2005, Jeffrey J. Kriz.
U.S. Appl. No. 11/254,569, filed Oct. 20, 2005, James D. Seefeldt, et al.
U.S. Appl. No. 11/254,474, filed Oct. 20, 2005, James D. Seefeldt.
U.S. Appl. No. 11/254,466, filed Oct. 20, 2005, James D. Seefeldt.
Hwant, In-Chul, "A CMOS Self-Regulating VCO With Low Supply Sensitivity, " IEEE Journal of Solid-State Circuits, Vo. 39, No. 1, Jan. 2004, pp. 42-48.

(Continued)

*Primary Examiner*—Joseph Chang
(74) *Attorney, Agent, or Firm*—McDonnell Boehnen Hulbert & Berghoff LLP

(57) ABSTRACT

An apparatus and method for providing a power supply compensated voltage or current is presented. A supply compensated current and voltage source utilizes a differential amplifier connected to a bandgap reference voltage and a scaled power supply voltage. When power supply varies, the differential amplifier regulates a stable compensated output. The output may be a compensated voltage or current. In addition, multiple currents and voltages may be referenced from the differential amplifier. The stable compensated output may be supplied as a reference bias for external circuitry. In addition, the compensated output may be supplied to a voltage controlled oscillator.

22 Claims, 6 Drawing Sheets

OTHER PUBLICATIONS

Shing, William, et al., "A 900-MHz CMOS Low-Phase-Noise Voltage-Controlled Ring Oscillator," IEEE Transactions on Circuits and Systems—II: Analog and Digital Signal Processing, vol. 48, No. 2, Feb. 2001, pp. 216-221.

Sun, Lizhong, et al., "A 1.25-GHz 0.35-μm Monolithic CMOS PLL Based on A Multiphase Ring Oscillator," IEEE Journal of Solid-State Circuits, vol. 36, No. 6, Jun. 2001 pp. 910-916.

Manatis, John G., "Low-Jitter Process-Independent DLL and PLL Based on Self-Biased Techniques," IEEE Journal of Solid-State Circuits, vol. 31, No. 11, Nov. 1996, pp. 1723-1732.

Park, Chan-Hong, "A Low-Noise, 900-MHz VCO in 0.6-μm CMOS," IEEE Journal of Solid-State Circuits, vol. 34, No. 5, May 1999, pp. 586-591.

Dong Pan, et al, "A Radiation-Hard Phase-Locked Loop," IEEE 2003, pp. 1-6.

* cited by examiner

POWER SUPPLY COMPENSATED VOLTAGE AND CURRENT SUPPLY

GOVERNMENT RIGHTS

The United States Government has acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to a current and voltage supply, and more particularly, a voltage controlled oscillator that is stable with respect to power supply variations.

BACKGROUND

Phase locked loops ("PLL") have been used extensively in analog electrical systems and communication systems. In today's high performance systems operating within increasingly stringent timing constraints, PLLs are being introduced in more general digital electronic circuits. For example, application specific integrated circuits ("ASIC") used in a variety of circuit applications typically include on-chip PLLs for clock signal distribution.

The key advantages that PLLs bring to clock distribution are phase/delay compensation, frequency multiplication and duty cycle correction. A PLL enables one periodic signal or clock to be phase-aligned to frequency multiples of a reference clock. As the name implies, the output of the PLL locks onto the incoming reference clock signal and generates a periodic output signal with a frequency equal to the average frequency of the reference clock. When the output PLL signal tracks the reference signal, the PLL is said to be "locked."

A PLL, however, will only remain locked over a limited frequency range or shift in frequency called a hold-in or lock range. The PLL generally tracks the reference signal over the lock range, provided the reference frequency changes slowly. This maximum "locked sweep rate" is the maximum rate of change of the reference frequency for which the PLL will remain locked. If the frequency changes faster than this rate, the PLL will drop out of lock.

Other factors may cause loss of lock that may occur unexpectedly and suddenly. For example, a power supply voltage variation may result in a deviation in the output frequency of the PLL. A deviation in the output frequency may cause a PLL to drop out of lock. An example of a power supply variation that could cause a PLL to drop out of lock is an increased load on the power supply. The increase load may be introduced by an increased number of circuit components that are sharing the power supply.

Power supply variations may also create other nuisances, one such nuisance being the variation in output frequency itself. The PLL may still remain "locked", but a variable output frequency may cause instabilities in circuits referencing the PLL output.

A contributor to power supply variation is the voltage received by a voltage controlled oscillator (VCO) within a PLL. The function of the VCO is to generate the periodic output signal of the PLL. When a reference clock is being tracked by the PLL, a phase detector, along with other components, generates a voltage (or a current) representative of the phase difference between the reference clock and the output of the PLL. Basically, a VCO receives the generated voltage (or current) and translates it into the periodic output signal. For example, a high input voltage may be translated into an output signal with a fast frequency. A low input voltage, on the other hand, may be translated into an output signal with a low frequency.

If, however, power supply varies, the VCO may translate an input voltage into a range of periodic signals. That is, the periodic signal will vary as power supply varies. As a result, detrimental circuit errors that result from a deviation in PLL output or from a loss of lock in the PLL may occur. Therefore, there is a need for a power supply compensated voltage and current supply for a voltage controlled oscillator.

SUMMARY

An apparatus and a method for supplying a power supply compensated voltage and current is presented.

In one embodiment, a compensated voltage and current source comprises a differential amplifier that receives a bandgap reference voltage and a scaled power supply voltage as input. The differential amplifier also comprises a current source that is driven by a threshold reference circuit. When the power supply varies, a stable compensated current output is maintained by the differential amplifier. The compensated current is then fed to external circuitry, such as a VCO bias generator. The VCO bias generator may then output a signal to a waveform generator in order to create a supply compensated output.

In another embodiment, a compensated voltage is created by the differential amplifier. The compensated voltage may be used by external circuitry such as the VCO bias generator.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

A power supply compensated voltage and current source is presented. The compensated voltage and current source may be used to supply a voltage, current or both to external circuitry, such as a voltage controlled oscillator (VCO). A stable PLL output may be generated using a VCO that has voltage or current supplied by the compensated voltage and current source. Other circuits that benefit from the advantages of power supply variation compensation may also benefit from the embodiments of the present invention.

Figure 1:
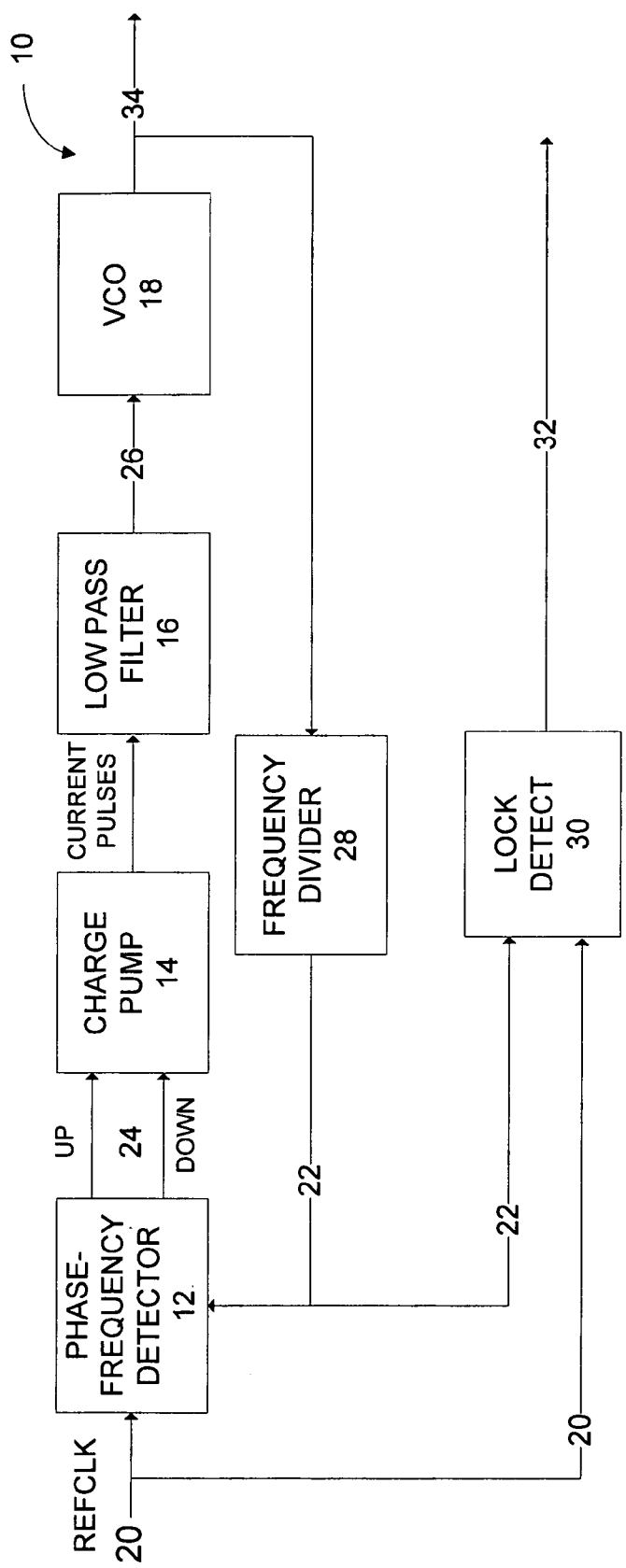
FIG. 1 is a block diagram of a phase locked loop.

Turning now to FIG. 1, a basic PLL 10 may consist of a phase-frequency detector 12, a charge pump 14, a loop (low pass) filter 16, a VCO 18 and a lock detector 30. The phase-frequency detector 12 receives a reference clock 20 and a derived (or feedback) clock 22. The output of the phase-frequency detector 12 is supplied to the charge pump 14. Output from the charge pump 14 is fed to low pass filter 16. Low pass filter 16 is connected to the VCO 18. The VCO 18 output is fed to frequency divider 28. The output of frequency divider 28 is fed back to the phase-frequency detector 12 and provided to the conventional lock detector 30. The lock detector 30 is also supplied the reference clock 20 to enable it to provide the conventional lock detect signal 32.

In operation, the phase detector 12 compares two input frequencies, generating an output that is a measure of their phase difference. For instance, the phase-frequency detector compares the input reference clock signal 20 (REFCLK) with the feedback clock signal 22 (FBKCLK) and generates an error signal 24 proportional to the magnitude of the phase/frequency difference between the two signals 20, 22. For purpose of illustration, the output signal 24 of the phase detector 12 is shown as up or down pulses 24 which would typically be input into a counter (not shown), which acts as a loop filter 16, to drive the VCO 18. In another embodiment, the phase detector 12 may output an n-bit phase error 24 that can be output to a standard digital filter.

The error signal 24 is fed to the charge pump 14 to alleviate the loading of the phase detector 12 on the PLL circuitry. The charge pump 14 current controls the magnitude of the charge stored in the loop filter 16, thus converting the phase-frequency detector 12 to a control voltage input 26 to the VCO 18. The VCO 18 generates an output frequency proportional to the control voltage 26.

When the PLL 10 is locked, there is a constant phase difference (usually zero) between the REFCLK 20 and FBKCLK 22 signals and their frequencies are matched. If the two signals are equal, there will be no magnitude output 24 from the phase detector 12. If the signals differ, the phase detector 12 outputs a corresponding voltage signal 24. In operation, the phase detector 12 compares REFCLK 20 with the oscillator output (through frequency divider 28) generating the periodic feedback clock output FBKCLK 22 that tracks REFCLK 20. If FBKCLK 22 from the oscillator falls behind REFCLK 20 in frequency, the phase detector 12 causes the charge pump 14 to change the control voltage, so that the oscillator 18 speeds up. Likewise, if FBKCLK 22 creeps ahead of REFCLK 20, the phase detector 12 causes the charge pump 14 to change the control voltage to slow down the oscillator 18. The low pass filter 16 smooths out the abrupt control inputs from the charge pump 14, so that the system tends towards a state where the phase detector 12 makes very few corrections. The result is a stable PLL output 34 which can be used in a variety of integrated circuit applications. One such application may be a clock generation circuit.

There are many circumstances, however, when the PLL 10 will not be able to produce a stable output 34. The lock detect 30 indicates when a stable output is or is not being output by measuring the REFCLK 20 and FBKCLK 22 signals. If there is not a stable output, lock detect 30 will produce a signal 32 corresponding to a "lock" condition not being met.

One such circumstance, as discussed above, that may cause a lock condition to not be met may be variation in currents or voltages used to generate a VCO output. In particular, small changes in voltages and currents that are used in amplification can cause a wide variation in VCO output. Unfortunately, small changes in voltage and current can occur when a power supply voltage varies. As a consequence, a slight variation in a reference current or voltage may cause a VCO 18 output (and in turn a PLL output 34), to be too fast or too slow when compared to REFCLK20. This may bring the PLL out of a "lock" condition.

Even if a lock condition is met, an increase or decrease in PLL output frequency 34 may cause deterimental effects. One such effect may be an increase in frequency in a clock circuit in an ASIC that employs the PLL 10. The increase in frequency may cause other circuits within the ASIC to cycle at an undesirable rate. This undesirable cycling rate could cause synchronization errors between circuit components within the ASIC. Because power supply variations can be intermittent or unexpected, it is important to supply a VCO with currents and voltages that are stable during power supply variations.

Figure 2:
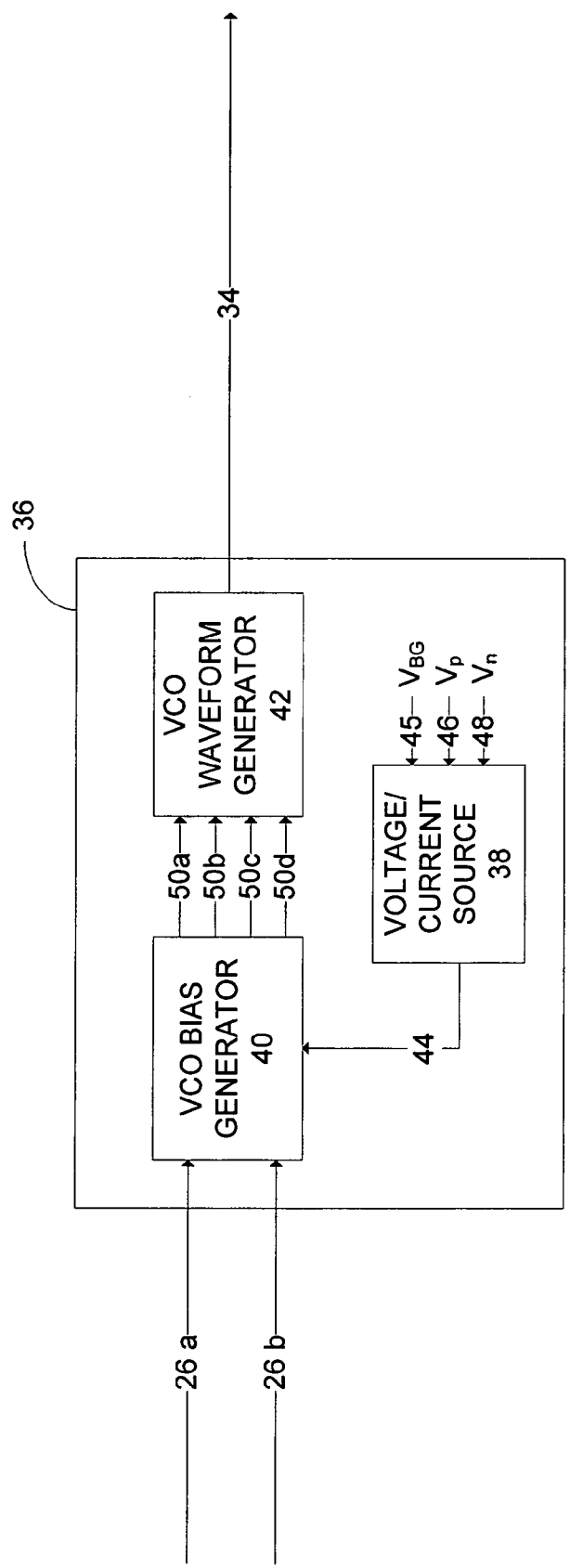
FIG. 2 is a block diagram of a voltage controlled oscillator in accordance with one embodiment of the present invention.

In order to prevent VCO power supply instability, VCO 36 is presented in FIG. 2. VCO 36 comprises Voltage/Current Source 38, VCO Bias Generator 40 and VCO Waveform Generator 42. Input into VCO 36 is differential voltage control 26a, 26b. In this embodiment, differential voltage control 26a, 26b is a differential signal; however, the signal may be single-ended as is illustrated in FIG. 1 (voltage control 26). Output from VCO 36 is PLL output 34.

Within VCO 36, VCO Bias Generator 40 is fed a compensated current 44 ("ICOMP") which is output from Voltage/Current Source 38 ("V/C Source"). V/C Source 38 is further described in FIG. 5. In another embodiement, V/C Source 38 may output a voltage signal. Or in even further embodiments, V/C Source 38 may output both current and voltage outputs. Independent on the types of output signals, V/C Source 38 receives a Band Gap voltage $V_{BG}$ 45, and power supply inputs $V_p$ and $V_n$ 46, 48.

Upon receiving ICOMP 44 and differential voltage control 26a, 26b, VCO Bias Generator 40 outputs reference currents 50a-d ("IREF"). IREFs 50a-d are fed to VCO Waveform Generator 42 which outputs the PLL output 34.

Figure 3A:
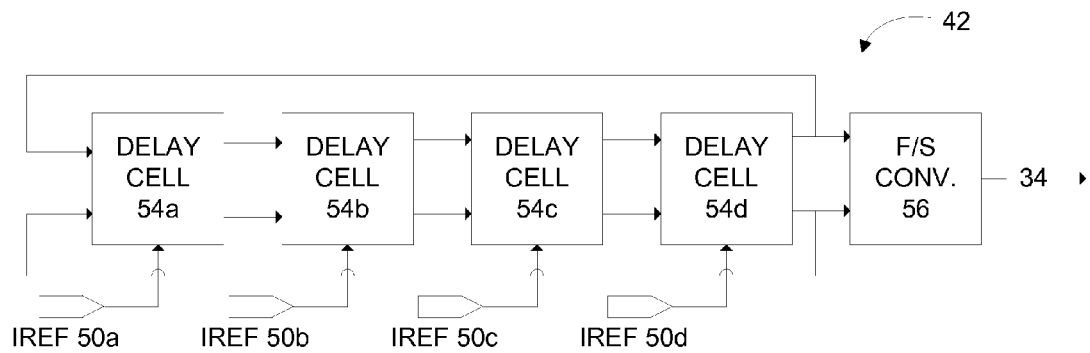
FIG. 3a is a block diagram of a VCO waveform generator in accordance with one embodiment of the present invention.

Turning now to FIG. 3a, waveform generator 42 comprises delay cells 54a-d and Full-swing to Single-ended Conversion 56 ("F/S"). Delay cells 54a-d respectively receive IREFs 50a-d. Delay cells 54a-d also receive differential input signals and output an amplified differential output. The differenial output of Delay cell 54d is fed back to delay cell 54a and it is also input to F/S 56. F/S 56 converts the full-swing differential signal to a single-ended, logic level, PLL output 34. If a full-swing signal is desired for PLL output 34, F/S 56 may be omitted. In addition, more or less delay cells may be used in further embodiments. The frequency, stability, and power consumption of the VCO 36 are dependent on the number of delay cells used. The impact of adding or subtracting delay cells will be discussed in detail in FIG. 3b.

Figure 3B:
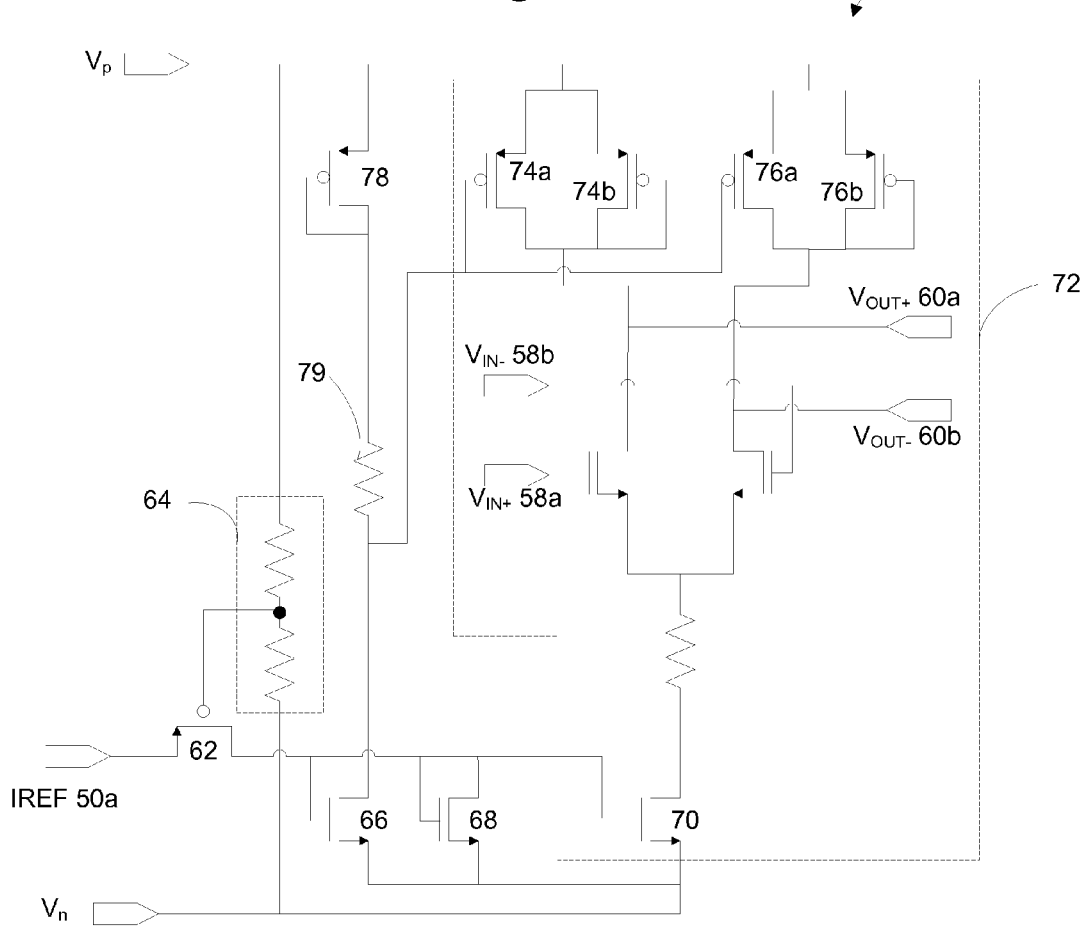
FIG. 3b is a circuit diagram of a delay cell in accordance with one embodiment of the present invention.

A circuit representation of individual delay cell 54a is illustrated in FIG. 3b. The nature and structure of delay cells 54a-d are all similar to the circuit representation of delay cell 54a. IREF 50a and differential inputs $V_{IN+}$ and $V_{IN-}$ 58a, 58b are input into delay cell 54a. Output from delay cell 54a are differential outputs $V_{OUT+}$ and $V_{OUT-}$ 60a, 60b. Within delay cell 54a, IREF 50a is fed to PMOS transistor 62. PMOS transistor 62 has a bias applied to its gate which is determined by a voltage divider 64, the source voltages of NMOS transistors 66, 68 and the gate voltage of NMOS transistor 70. NMOS transistor 70 is used as a current source within differential amplifier 72. In this embodiment, the differential amplifier includes an active load from PMOS transistors 74a, 74b and 76a, 76b. Also connected to the gates of active load PMOS transistors 74a and 76a is an output of PMOS transistor 78.

In operation, IREF 50a determines the biasing of transistors 66, 68 and 70. The higher the current value of IREF 50a, the higher the gate-source biasing on transistors 66, 68 and 70. The opposite correlation exists for decreasing current values of IREF 50a. If the gate-source biasing of transistor 70 increases, more current will be supplied to the tail end of differential amplifier 72.

When a differential voltage is applied to a differential amplifier, the signal applied at $V_{IN+}$ and $V_{IN-}$ 58a, 58b is amplified and inverted at $V_{OUT+}$ and $V_{OUT-}$ 60a, 60b. This is represented by the equation:

$$(V_{OUT+}-V_{OUT-})=A_V(V_{IN+}-V_{IN-})$$

The transition time, or delay time ("τ"), of the amplification is proportional to the amount of current applied to the tail end of differential amplifier 72. Essentially, the more current supplied to the differential amplifier 72, the slower the latching within the differential amplifier 72. Therefore, when the current through transistor 70 increases, the delay time τ increases. Also, when the current through transistor 70 decreases, it is easier for the differential amplifier to invert and the delay time τ decreases. Because transistor 70 is directly influenced by IREF 50a, varying IREF 50a gives direct control of the delay time τ.

The delay time τ may also be adjusted by transistor 78. Transistor 78, along with a resistor 79, is used to bias transistors 74a, 76a. The function of transistors 78, 74a and 76a is to compensate for delay times in the active load 74a, 74b and 76a, 76b. Basically, transistors 74a and 76a turn on early before a transition from "high" to "low" or "low" to "high" takes place. The extra current supplied by these transistors reduces the delay time τ by reducing the amount of time it takes the active load to transition. Since IREF 50a directly controls the amount of current through transistor 66, varying IREF 50a also affects the delay time τ by adjusting the active load of differential amplifier 72.

In the above embodiment of FIG. 3a, the feedback loop of delay cells 54a-d will eventually produce a steady state waveform. Initially, a small perturbation in differential input will be subsequently amplified until a threshold of amplification is reached. The inverted differential output of delay cells 54a, 54d will produce an oscillating waveform that has a leading edge that will be delayed by delay time τ in each individual delay cell. A leading edge will cycle through delay cells 54a, 54d two times before returning to its original voltage level. The overall frequency, therefore, of the VCO 36 is calculated as:

$$f = \frac{1}{2N\tau}$$

Where N is the number of delay cells. As discussed above, fewer delay cells may be used and a faster frequency output will be created. However, the trade-off in using fewer delay cells is a reduction in stability. Noise and other nuisances may cause this instability by unwanted deviations in frequency or phase shift. Adding delay cells may increase circuit stability, but power consumption will increase and frequency will decrease. These considerations will need to be made by a circuit designer in choosing the appropriate tolerances of a given VCO. One advantage of the above embodiment, in which four delay cells are used, is that a 90 degree phase shift takes place between each delay cell. This type of phase shift may be convenient for determining output frequency poles.

Clearly, IREFs 50a-d, have a significant impact on the output frequency of the VCO 36. As pointed out above, unwarranted variations in current (i.e., variations caused by power supply variation) may significantly impact delay time τ and in turn directly impact the output frequency of the VCO 36.

Figure 4:
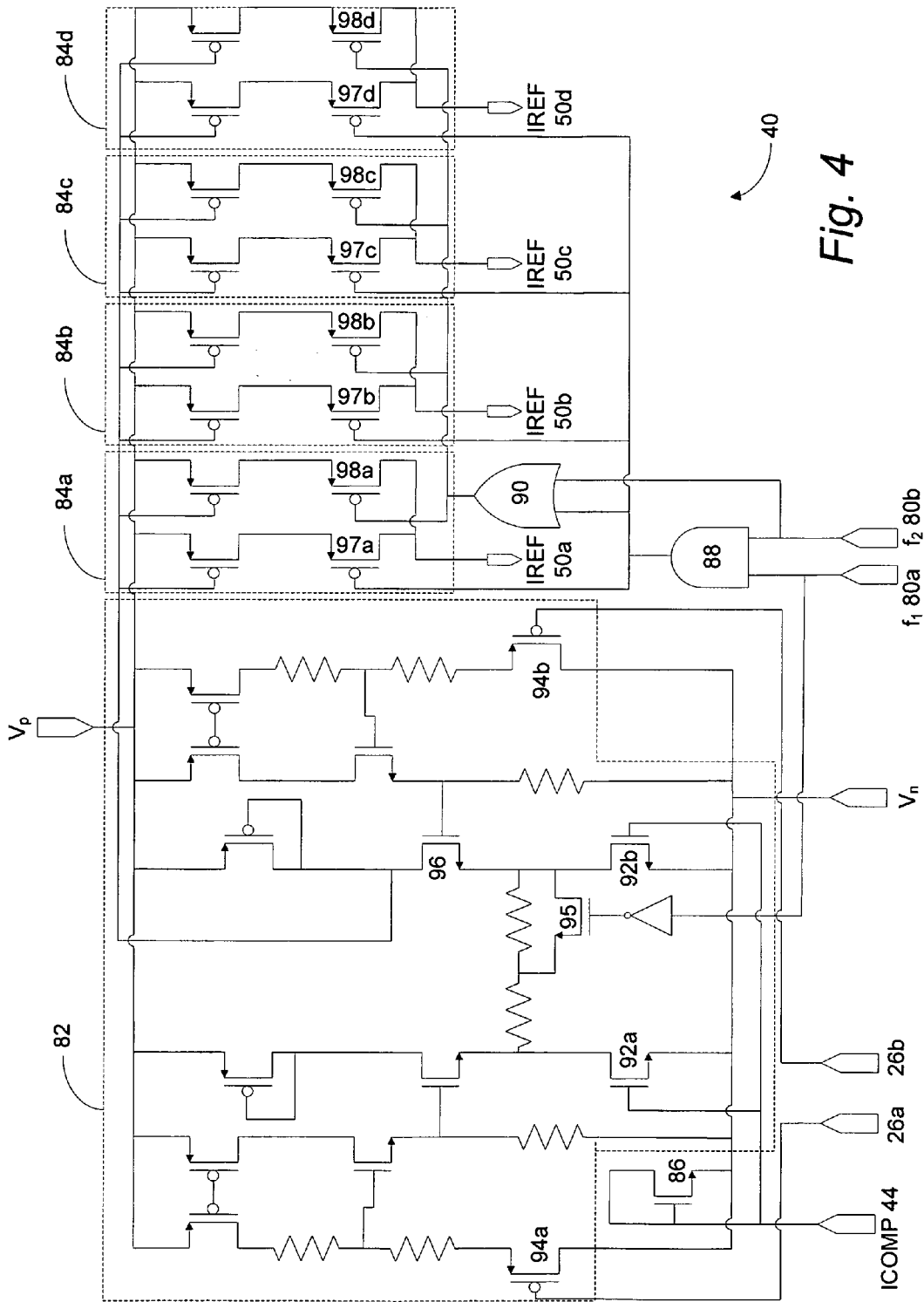
FIG. 4 is a circuit diagram of a VCO bias generator in accordance with one embodiment of the present invention.

In order to understand how IREFs 50a-d are generated, a circuit embodiment of VCO Bias Generator 40 is illustrated in FIG. 4. In this circuit, ICOMP 44 and voltage controls 26a, 26b are input. IREFs 50a-d are output. Also, in further embodiments, frequency selects $f_1$ 80a, $f_2$ 80b may also be input.

Within VCO Bias Generator 40 is differential amplifier 82, current mirrors 84a-d, NMOS transistor 86, AND gate 88 and OR gate 90. ICOMP 44, the power supply compensated current, is used to bias transistors 92a, 92b within differential amplifier 82. Similar to the differential amplifier 72 in FIG. 3, transistors 92a, 92b serve as a tail current source. Differential voltage control signals 26a, 26b bias PMOS transistors 94a, 94b. The gain may be increased by turning transistor 95 "on" or "off" with frequency select $f_1$ 80a. Also within differential amplifier 82, transistor 96 provides a voltage at its drain that is mirrored to the gates of PMOS transistors within current mirrors 84a-d.

Along with receiving output from PMOS transistor 96, current mirrors 84a-d also receive a logical AND 88 of frequency select signals 80a, 80b along with a logical OR 90 of logical AND 88 and frequency select 80b. The output of logical AND 88 and logical OR 90 are used to drive separate PMOS transistors 97a-d and 98 a-d within current mirrors 84a-d. IREFs 50a-d are output from the drains of PMOS transistors 97a-d and 98a-d.

In operation, when VCO 36 reaches a steady state (i.e., when REFCLK 20 and FBKCLK 22 are matched), the differential voltage control signals 26a, 26b will remain relatively stable. Before VCO 36 reaches a steady state, the differential control signals will adjust the output currents IREF 50a-d (either up or down) until the frequency of REFCLK 20 and FBKCLK 22 are matched. However, positive or negative deviations in the frequencies of REFCLK 20 and FBKCLK 22 will also translate to an increasing or decreasing differential voltage. Again, increasing or decreasing IREFs 50a-d will increase or decrease the delay time τ, which is inversely proportional to the output frequency. In order to change IREFs 50a-d, differential amplifier 82 directly controls the amount of current that IREFs 50a-d will output.

Because power supply variation can cause an undesirable output, particularly in amplification, ICOMP 44 controls the amount of current through the current source within differential amplifier 82. The voltage at the gate of NMOS transistor 86, which is determined by ICOMP 44, is applied to the gates of transistors 92a, 92b. ICOMP 44 is negatively proportional to absolute temperature. That is, when temperature increases, ICOMP 44 will decrease and the current through the current source (i.e, transistors 92a, 92b) in differential amplifier 82 will also increase. If ICOMP 44 were not negatively proportional to absolute temperature, the differential amplifier 82 would increase in gain as temperature increases. Increasing the gain would erroneously increase the output frequency of the PLL 10. The generation of ICOMP 44 is further described in FIG. 5.

Another influence on the gain of differential amplifier 82 is transistor 95. If $f_1$ 80a is high (i.e., frequency $f_1$ is selected), transistor 95 will turn off. Essentially, the gain of the amplifier will be reduced as the resistance from the drain of transistor 92a to the drain of transistor 92b has been increased. Being able to adjust the gain of the differential amplifier 82 affects the sensitivity of the output of bias generator 40. If the gain is low, differential amplifier 82 will not increase in output voltage (at the drain of transistor 96) as significantly as if the gain is high. Because the bias generator 40 is frequency selectable, adjusting the gain is useful for changing the sensitivity of inputs 26a, 26b for different frequency ranges. Selecting different frequency ranges $f_1$ 80a, $f_2$ 80b, will be discussed below.

Upon receiving an increasing or decreasing voltage signal from voltage control signals 26a, 26b, the voltage at the drain of transistor 96 will either increase or decrease. Increasing the drain voltage will decrease the current through current mirrors 84a-d and vice versa. In various other embodiments and as discussed above, current mirrors 84a-d may be adjustable so as to select the amount of output current with frequency select inputs. For example, in FIG. 4, frequency selects 80a, 80b undergo logical operations before being applied to gates of PMOS transistors 97a-d, 98a-d. If, for example, $f_1$ 80a is selected (by a logic "high"), the output of AND 88 will be "low" and PMOS transistors 97a-d will turn on. However, if $f_2$ 80a is selected, the output of AND 88 will be "high" and the output of OR 90 will be "low". In this instance, only PMOS transistors 98a-d will be on. If only these PMOS transistors are on, lower IREF currents 50a-d will be output. Therefore, a lower delay time τ will result and the output frequency will be higher. In this embodiment, if both frequency selects $f_1$ 80a, $f_2$ 80b are selected, the bias generator 40 may be turned off as transistors 97a-d and 98a-d will be off.

If, however, only one frequency is desired to be output, a single frequency input or even no frequency inputs may be used. In other embodiments, AND 88 and OR 90 could be removed and only one set of transistors (i.e., 97a-d or 98a-d) could be used. A constant bias could be applied to either set of transistors. The gain adjustment via transistor 95 could also be removed in various embodiments.

As described above, more or fewer IREFs 50a-d may be used depending on the number of delay cells within a VCO 36. In the bias generator 40, current mirrors 84a-d are used in lieu of current dividers. Current mirrors provide a determinable amount of current output that is not limited to intrinsic resistances, or variations due to processing that may cause subtle differences in currents that could result from current dividers. If stable current outputs are available from a current divider, additional embodiments may generate IREFs 50a-d from a current divider, however.

The overall power supply variation independence of VCO 36 is dependent upon ICOMP 44. If ICOMP 44 were to vary with power supply variation, the amount of current through differential amplifier 82 would inadvertently increase or decrease. Inadvertent increases or decreases in ICOMP 44 would produce many problems in VCO 36. One problem is a lack of control in output frequency. For example, without any means or method to correct for power supply instability, a power spike could increase ICOMP 44. ICOMP 44 may then increase the gain of differential amplifier 82. The higher gain would translate to lower IREF 50a-d currents. If IREFs 50a-d decrease, the delay time τ of waveform generator 42 would decrease and the output frequency would increase. Many other types of inadvertent and detrimental effects could occur if ICOMP 44 were not power supply variation independent.

Figure 5:
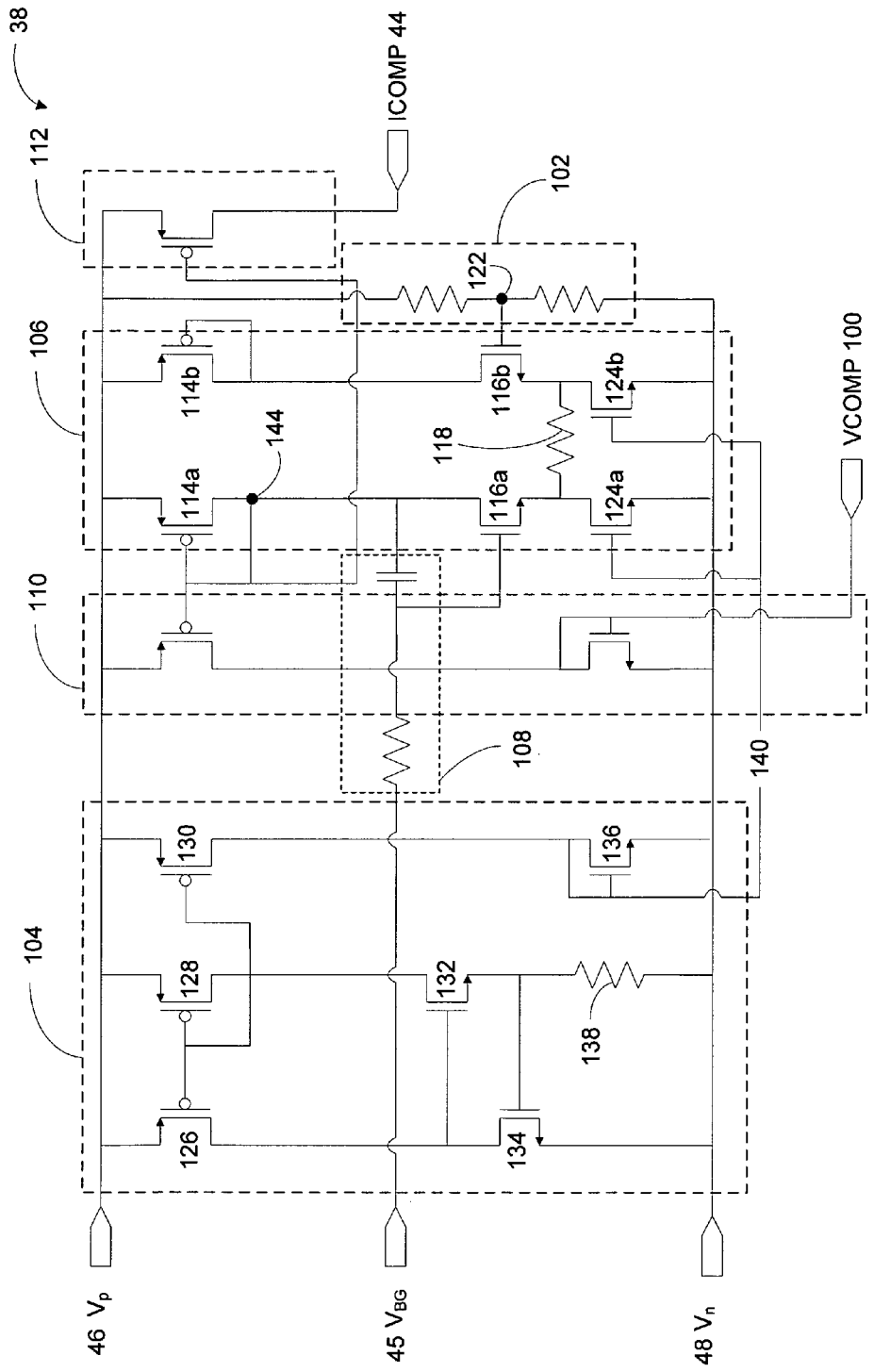
FIG. 5 is a circuit diagram of a voltage and current source in accordance with one embodiment of the present invention.

Therefore, FIG. 5 illustrates a circuit embodiment of V/C SOURCE 38 with power supply compensation. $V_{BG}$ input 44, power supply voltage $V_p$ 46 and a common voltage $V_n$ 48 are supplied to the V/C SOURCE 38. Power supply compensated current and voltage sources ICOMP 44 and VCOMP 100 are output. IREF 44 and VCOMP 100 are also negatively proportional to absolute temperature. VCOMP 100 has not been used in the previously mentioned embodiments; however, further embodiments of the present invention may utilize a compensated voltage instead of a compensated current. Or, other embodiments may use both ICOMP 44 and VCOMP 100. In addition, the $V_{BG}$ input 45 may be an output from a conventional bandgap reference circuit. The $V_{BG}$ input 45 alternatively may be some other type of temperature compensated voltage. Also, $V_p$ 46 and $V_n$ 48 may be the same power supply supplied to other components within the PLL 10. $V_p$ 46 and $V_n$ 48 may also be independent of power supplied to other parts of the PLL.

The V/C SOURCE 38 comprises a voltage divider 102, a voltage reference circuit 104 and a differential amplifier 106. Components that may also be included in this embodiment are a filter 108, a voltage mirror circuit 110 and a current mirror circuit 112.

The differential amplifier 106 comprises PMOS transistors 114a, 114b, NMOS transistors 116a, 116b, resistor 118, and NMOS transistors 124a, 124b. The sources of the active load PMOS transistors 114a, 114b are connected to the power supply 46. The drains of transistors 114a, 114b are connected to the drains of transistors 116a, 116b. The gate of transistor 116a is biased by $V_{BG}$ input 44 (which may be filtered by filter 108) and the gate of transistor 116b is biased by node 120 within voltage divider 122. Resistor 118 joins the sources of transistors 116a, 116b. Also connected to the sources of transistors 116a, 116b are the sources of transistors 124a, 124b. Transistors 124a, 124b form a current supply. In other embodiments, the current supply may comprise a different arrangement of transistors or another type of current supply. In addition, differential amplifier 106, as well as V/C SOURCE 38, may also comprise additional circuit elements (such as bipolar junction transistors in lieu of MOS transistors).

As described above, the gate of transistor 116a is biased by $V_{BG}$ 44. Biasing transistor 116a with $V_{BG}$ allows the gate of transistor 116b to be compared to a constant voltage reference within differential amplifier 106. The gate of transistor 116b, on the other hand, is biased by node 122 within voltage divider 102. Voltage divider 102 comprises two series connected resistors. The power supply 46 to common voltage 48 ($V_p$–$V_n$) is distributed across the series connected resistors. When the power supply 46 varies, the bias applied to the gate of transistor 116 from node 122 will also vary. This variation will be a scaled down version of the power supply variation. For example, if a nominal voltage of 3 V is used to bias the gate of transistor 116 and power supply 46 has a voltage level of 5V, two resistors having values of 2 kΩ and 3 kΩ may be used within voltage divider 102. In this example, if the power supply were to spike to 5.5V, the applied bias to the gate of transistor 116 would jump to 3.3V.

Both transistors 116a, 116b are connected to transistors 124a, 124b. The gates of transistors 124a, 124b are biased by voltage reference circuit 104. Voltage reference circuit 104 comprises transistors 126-136 and resistor 138. In this embodiment, the reference circuit 104 uses a threshold referenced current source to produce a negatively proportional to absolute temperature output at transistor 132. Other embodiment may comprise other reference circuits to produce a voltage or current output.

In the voltage reference circuit 104, an input current travels through transistors 126 and 134. Transistors 128 and 132 produce an output current. Because the gate of transistor 132 is connected to the drain of transistor 134, the output current through transistors 128 and 132 will have more of a dependence on threshold voltage than on the input current through transistors 126 and 134. Therefore, the effects of power supply variation on the output current through transistors 126 and 134 will be dampened. This output current at transistor 132 is mirrored and a voltage 140 is generated and used to bias transistors 124a, 124b. The voltage 140 will be negatively proportional to absolute temperature.

If temperature increases, voltage 140 will decrease and the current through transistors 124a, 124b will decrease. Also decreasing will be the current through transistor 116b and 116a. ICOMP 44 and VCOMP 100 will also decrease. When temperature decreases, however, the opposite effect is observed. That is, ICOMP 44 and VCOMP 100 will increase. The amount of negative proportionality with absolute temperature may be determined by design of V/C Source 38. This may include the design of components within V/C Source 38, including: voltage reference circuit 104, voltage mirror circuit 110, current mirror circuit 112 and/or differential amplifier 106.

Turning again to differential amplifier 106, power supply variation compensation can be observed in the following examples. If no variation in power supply occurs, the voltage at the drains of transistors 116a (node 144) will remain constant. Voltage mirror circuit 110 may be used to create VCOMP 100 and current mirror circuit 112 may be used to create ICOMP 44. Additional voltage or current references may be created by adding current and voltage mirrors.

If the power supply increases (i.e., $V_p$--$V_n$), the bias applied to the gate of transistor 116b will increase and the current through transistor 116b will also increase. Because transistor 116a has a reference voltage derived bias, the increase in current through transistor 116b will be larger than the current through transistor 116a. Basically, the voltage at node 122 will be compared to the gate voltage at transistor 116a (i.e., a representation of $V_{BG}$ 45). The current through transistors 124a, 124b also increases with increased power supply. A compensating current from transistor 116b will travel through resistor 118 to compensate for the increase in current through transistors 124a, 124b. The compensating current will prevent a large increase in current in transistor 116a. Therefore, the change in voltage and current at node 144 will be dampened. If the power supply voltage decreases, the gate voltage applied to transistor 116b will decrease. The compensating current will travel the opposite direction across the resistor 118. Again, the overall effect at node 144 will be dampening of voltage changes by compensating currents traveling across resistor 108.

Figure 6A:
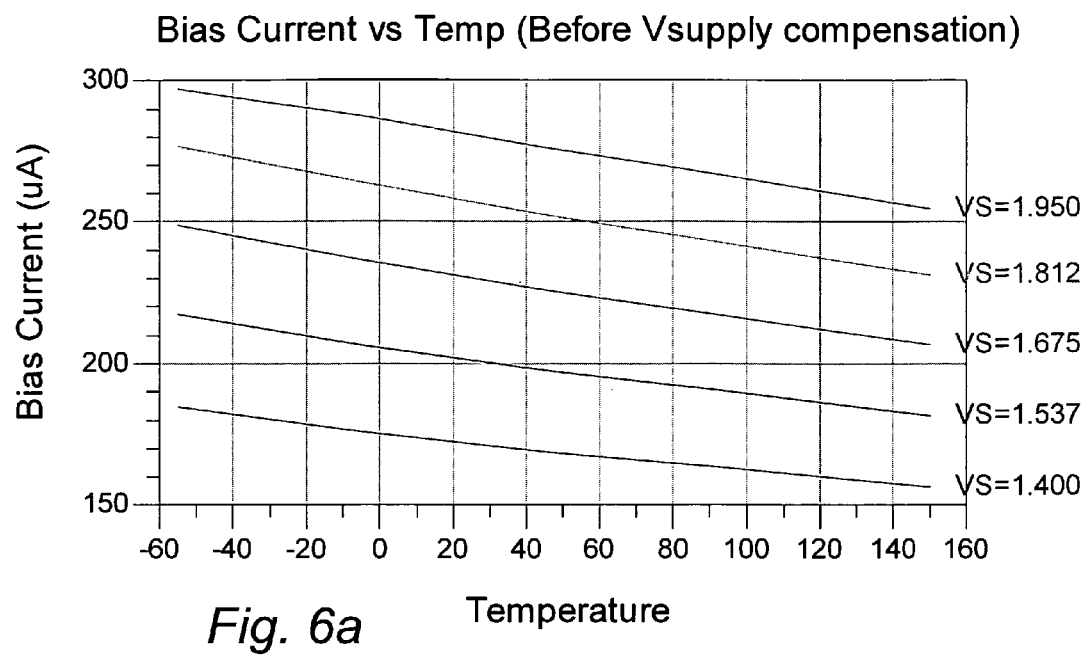
FIG. 6a is a graph illustrating bias current output with power supply variation.
Figure 6B:
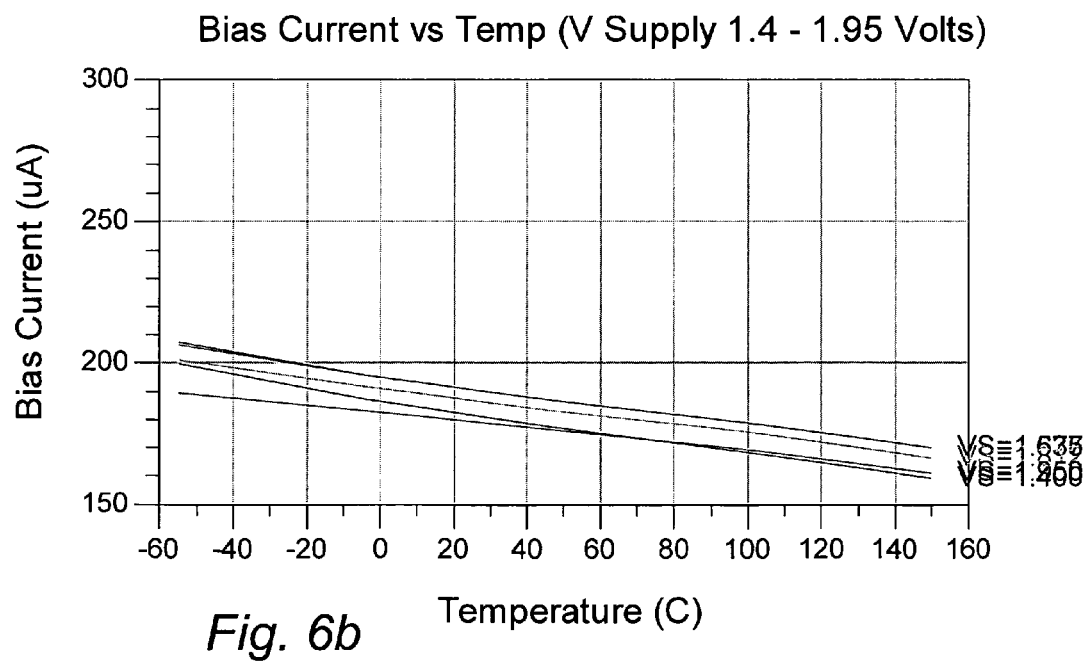
FIG. 6b is a graph illustrating bias current output with power supply variation in accordance with one embodiment of the present invention.

The dampening effect on output voltages (or currents) with varying power supply voltages can be seen in the graphs of FIGS. 6a-b. FIG. 6a illustrates ICOMP 44 output with increasing temperature with a varying power supply being supplied to an uncompensated differential amplifier. FIG. 6b illustrates the damping effect of using a power supply compensated differential amplifier 106. In FIGS. 6a-b, the supply voltage (VS) is varied from 1.4-1.95. In both figures, a bias current (ICOMP 44) references node 44 using a current mirror (as is illustrated in FIG. 5). In FIG. 6a, the bias current (ICOMP 44) varies considerably with changing supply voltage. In FIG. 6b, however, the change in bias current (ICOMP 44) with changing power supply voltage is significantly reduced.

The above embodiments describe a phase locked loop with a VCO that comprises a power supply compensated current and voltage supply. In various embodiments, the current and voltage source may be used to provide a stable current and/or voltage to a VCO. The stable current or voltage provided to the VCO allows the VCO to output a waveform that is more insensitive to power variations that may have detrimental effects to conventional VCOs.

In various other embodiments, the power supply compensated current and voltage supply may be used by other types of circuitry that requires a stable bias. The power supply compensated current and voltage supply is not limited to only being used in a VCO or a PLL.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A power supply compensated voltage and current supply, comprising:
   a first resistor connected in series with a second resistor at a reference node, wherein a supply voltage is distributed across the first and second resistors;
   a voltage reference source;
   a differential amplifier having first and second voltage inputs and a compensated output, the first input connected to the reference node and the second input connected to the voltage reference source;
   a first transistor having a gate connected to the first voltage input;
   a second transistor having a gate connected to the second voltage input; and
   a third resistor having first and second terminals, the first terminal connected to the source of the first transistor and the second terminal connected to the source of the second transistor a current source having first and second inputs, the first input connected to a source of the first transistor and the second input connected to a source of the second transistor.

2. The apparatus of claim 1, wherein the current source comprises third and fourth transistors, and wherein a drain of the third transistor is connected to the first input of the current source and a drain of the fourth transistor is connected to the second input of the current source.

3. The apparatus of claim 2, wherein gates of the third and fourth transistors are connected to a second voltage reference source.

4. The apparatus of claim 3, wherein the second voltage reference source is a threshold reference voltage source.

5. The apparatus of claim 1, wherein the voltage reference source is a bandgap voltage reference source.

6. The apparatus of claim 1, further comprising a current mirror connected to the compensated output, wherein the current mirror outputs a supply compensated current.

7. The apparatus of claim 6, further comprising:
a MOS transistor connected to an output of the current mirror, wherein the MOS transistor is operable to receive the compensated current and produce the compensated output.

8. The apparatus of claim 1, wherein the compensated output is supplied to a reference input of a voltage controlled oscillator.

9. The apparatus of claim 6, wherein the compensated current is supplied to a current reference input of a voltage controlled oscillator.

10. The apparatus of claim 7, wherein the compensated voltage is supplied to a voltage reference input of a voltage controlled oscillator.

11. A method of compensating for power supply variation, the method comprising:
inputting a reference voltage into a first voltage input of a differential amplifier, wherein the first voltage input is coupled to gate of a first transistor of the differential amplifier;
dividing a supply voltage across at least two resistances so as to create a scaled supply voltage;
inputting the scaled supply voltage into a second voltage input of the differential amplifier, wherein the second voltage input is coupled to a gate of a second transistor of the differential amplifier, providing a first resistor coupled to sources of the first and second transistors; and
providing an output of the differential amplifier to a reference input of external circuitry providing current sources within the differential amplifier wherein the current sources having first and second inputs, the first input connected to a source of the first transistor and the second input connected to a source of the second transistor.

12. The method of claim 11, wherein the reference input is a current reference input.

13. The method of claim 11, wherein the reference input is a voltage reference input.

14. The method of claim 11 wherein the reference voltage is a bandgap reference voltage.

15. The method of claim 11, further comprising using a threshold reference source to bias a current source within the differential amplifier.

16. The method of claim 11, wherein the external circuitry is a voltage controlled oscillator.

17. A voltage controlled oscillator, comprising:
a waveform generator having an input and a waveform output;
a bias generator having a control input, a reference input, and an output, wherein the output of the bias generator is connected to the input of the waveform generator; and
a supply compensated source having reference and supply inputs and a reference output, wherein the reference output of the compensated source is connected to the reference input of the bias generator, wherein the compensated source comprises a differential amplifier having a first input connected to the reference input of the compensated source, a second input connected to the supply input and an output connected to the reference output of the compensated source, and wherein the differential amplifier comprises;
a first transistor having a gate connected to the first input;
a second transistor having a gate connected to the second input;
a third resistor having first and second terminals, the first terminal connected to the source of the first transistor and the second terminal connected to the source of the second transistor a current source having first and second inputs, the first input connected to a source of the first transistor and the second input connected to a source of the second transistor.

18. The apparatus of claim 17, wherein the current source comprises third and fourth transistors, and wherein a drain of the third transistor is connected to the first input of the current source and a drain of the fourth transistor is connected to the second input of the current source.

19. The apparatus of claim 18, wherein gates of the third and fourth transistors are connected to a second voltage reference source.

20. The apparatus of claim 19, wherein the second voltage reference source is a threshold reference voltage source.

21. The apparatus of claim 17, wherein the control input is a differential control input.

22. The apparatus of claim 17, wherein the reference input of the compensated source is a bandgap reference voltage.

* * * * *